(12) United States Patent
Chen

(10) Patent No.: US 9,748,516 B2
(45) Date of Patent: Aug. 29, 2017

(54) FUNCTIONAL FILM

(71) Applicant: Industrial Technology Research Institute, Hsinchu (TW)

(72) Inventor: Kuang-Jung Chen, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/948,392

(22) Filed: Nov. 23, 2015

(65) Prior Publication Data
US 2016/0079561 A1 Mar. 17, 2016

Related U.S. Application Data

(62) Division of application No. 13/909,082, filed on Jun. 4, 2013, now Pat. No. 9,252,389.

(30) Foreign Application Priority Data

Dec. 14, 2012 (TW) .............................. 101147602 A

(51) Int. Cl.
*B32B 3/00* (2006.01)
*H01L 51/52* (2006.01)
*B32B 7/14* (2006.01)

(52) U.S. Cl.
CPC ............ *H01L 51/5246* (2013.01); *B32B 7/14* (2013.01); *H01L 51/5253* (2013.01); *B32B 2307/748* (2013.01); *B32B 2457/00* (2013.01); *H01L 2251/5338* (2013.01); *H01L 2924/0002* (2013.01); *Y10T 156/10* (2015.01); *Y10T 156/109* (2015.01); *Y10T 428/1476* (2015.01)

(58) Field of Classification Search
CPC ............ H01L 51/5246; H01L 51/5253; H01L 2251/5338; B32B 7/14; Y10T 156/10; Y10T 156/109; Y10T 428/1476
See application file for complete search history.

(56) References Cited

U.S. PATENT DOCUMENTS

2010/0258346 A1* 10/2010 Chen ...................... H01L 21/56
174/521

* cited by examiner

*Primary Examiner* — Elizabeth Mulvaney
(74) *Attorney, Agent, or Firm* — Jianq Chyun IP Office

(57) ABSTRACT

An environmentally sensitive electronic device package including a first adhesive, at least one first side wall barrier, a first substrate, and a second substrate is provided. The first adhesive has a first surface and a second surface opposite to the first surface. The first side wall barrier is distributed in the first adhesive. The first substrate is bonded with the first surface. The first substrate has an environmentally sensitive electronic device formed thereon and the environmentally sensitive electronic device is surrounded by the first side wall barrier. The second substrate is bonded with the second surface. A manufacturing method of the environmentally sensitive electronic device package is also provided.

4 Claims, 13 Drawing Sheets

FUNCTIONAL FILM

CROSS-REFERENCE TO RELATED APPLICATION

This application is a divisional application of and claims the priority benefit of U.S. application Ser. No. 13/909,082, filed on Jun. 4, 2013, now allowed, which claims the priority benefit of Taiwan application serial no. 101147602, filed on Dec. 14, 2012. The entirety of each of the above-mentioned patent applications is hereby incorporated by reference herein and made a part of this specification.

TECHNICAL FIELD

The technical field relates to a package and a manufacturing method thereof, and more particularly, to an environmentally sensitive electronic device package and a manufacturing method thereof.

BACKGROUND

Compared to general rigid substrates, flexible substrates are more broadly used for they are windable, portable, secure, and widely applicable. However, flexible substrates also come with some disadvantages. For example, flexible substrates are not heat resistant or chemical resistant and offer low moisture and oxygen barrier properties and large coefficients of thermal expansion. A typical flexible substrate can be adopted for carrying electronic devices and/or packaging the electronic devices as a cover. Because a flexible substrate cannot completely obstruct the passage of moisture and oxygen, the moisture and oxygen will speed up the aging of the electronic devices on the flexible substrate and accordingly the lifespan of the electronic devices will be shortened undesirably.

SUMMARY

The disclosure provides a functional film and a manufacturing method thereof, so as to offer good moisture and oxygen obstruction capability.

The disclosure further provides an environmentally sensitive electronic device package and a manufacturing method thereof, so as to offer good moisture and oxygen obstruction capability.

The disclosure provides a functional film including an adhesive, at least one side wall barrier, and a first de-bonding film. The adhesive has a first surface and a second surface opposite to the first surface. The side wall barrier is distributed in the adhesive. The first de-bonding film is adhered with the first surface.

The disclosure provides a manufacturing method of a functional film. The manufacturing method includes following steps. An adhesive is formed on a first de-bonding film. At least one side wall barrier is then formed in the adhesive.

The disclosure provides an environmentally sensitive electronic device package including a first adhesive, at least one first side wall barrier, a first substrate, and a second substrate. The first adhesive has a first surface and a second surface opposite to the first surface. The first side wall barrier is distributed in the first adhesive. The first substrate is bonded with the first surface, wherein at least one environmentally sensitive electronic device is disposed on the first substrate. The second substrate is bonded with the second surface.

The disclosure provides a manufacturing method of an environmentally sensitive electronic device package. The manufacturing method includes following steps. A first adhesive is formed on a first substrate so that the first adhesive is bonded with the first substrate, wherein at least one environmentally sensitive electronic device is disposed on the first substrate. At least one first side wall barrier is then formed in the first adhesive. A second substrate is bonded with the first adhesive so that the first adhesive is between the first substrate and the second substrate.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIGS. 3A'-3C' are diagrams illustrating a manufacturing method of the functional film in FIG. 2A.

DETAILED DESCRIPTION OF DISCLOSED EMBODIMENTS

First Embodiment

Figure 1A:
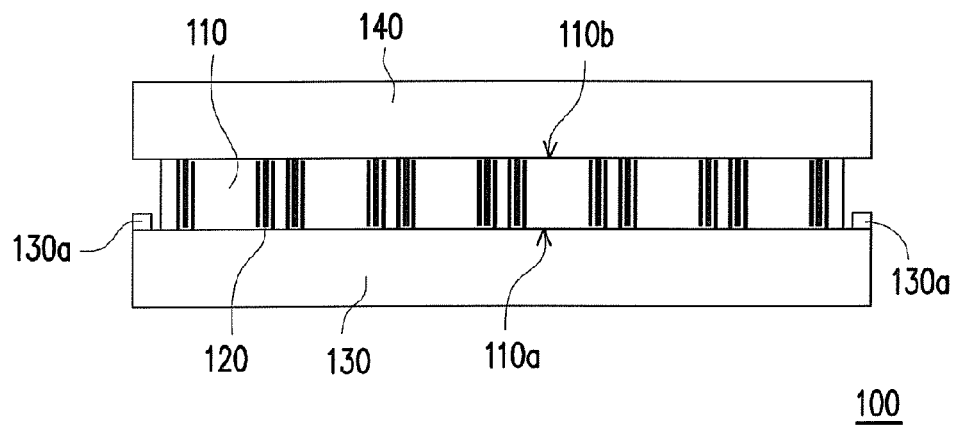
FIG. 1A is a cross-sectional view of a functional film according to a first embodiment of the disclosure.

FIG. 1A is a cross-sectional view of a functional film according to the first embodiment of the disclosure. Referring to FIG. 1A, the functional film 100 in the present embodiment includes an adhesive 110, at least one side wall barrier 120, a first de-bonding film 130, and a second de-bonding film 140. The adhesive 110 has a first surface 110a and a second surface 110b opposite to the first surface 110a. The side wall barrier 120 is distributed in the adhesive 110. The first de-bonding film 130 is adhered with the first surface 110a. The second de-bonding film 140 is adhered with the second surface 110b. Generally, the first de-bonding film 130 and the second de-bonding film 140 of the functional film 100 can be respectively removed from the first surface 110a and the second surface 110b of the adhesive 110 by applying appropriate forces. In the present embodiment, the adhesive 110 may be an optical adhesive of a specific transmission. However, in the present embodiment, the adhesive 110 may also be a reflective adhesive or a transflective adhesive. To be specific, the adhesive 110 may be made of epoxy, acrylic compound, or silicone. In the present embodiment, the adhesive 110 may be made of a material which can be cured through heating or light irradiation. In other words, the adhesive 110 may be made of a material that is not yet cured through heating or light irradiation. The side wall barrier 120 may be made of a metal or a metal oxide. The first de-bonding film 130 and the second de-bonding film 140 may be made of parylene. The first de-bonding film 130 and the second de-bonding film 140 are respectively adhered with the first surface 110a and the second surface 110b of the adhesive 110 to prevent the adhesive 110 from being contaminated by external impurities. Additionally, in the present embodiment, the first de-bonding film 130 has an alignment mark 130a. The alignment mark 130a is located outside the distribution area of the adhesive 110. However, the disclosure is not limited thereto, and in other embodiments, the alignment mark 130a may also be completely or partially covered by the adhesive 110. The alignment mark 130a ensures the position of the adhesive 110 on the first de-bonding film 130 and diminishes misalignment. Additionally, the alignment mark 130a facilitates subsequent processes.

Even though the present embodiment is described by taking the functional film 100 having both the first de-bonding film 130 and the second de-bonding film 140 as an example, in other embodiments, the functional film 100 may also have only one de-bonding film. In other words, the functional film 100 may have only the first de-bonding film 130 or only the second de-bonding film 140.

Figure 1B:
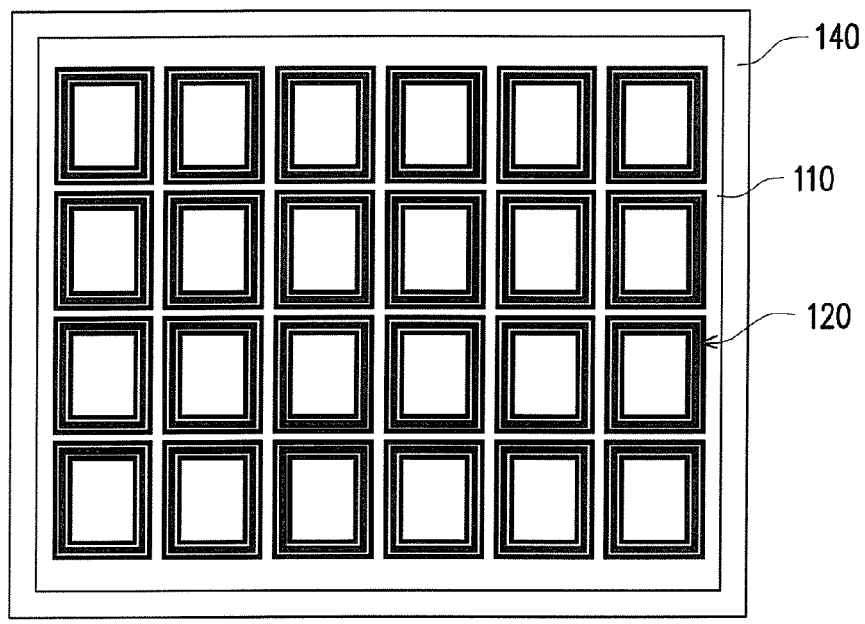
FIG. 1B is a top view of the functional film in FIG. 1A.

FIG. 1B is a top view of the functional film in FIG. 1A. Referring to FIG. 1B, in the present embodiment, the side wall barrier 120 may be a continuous pattern formed in the adhesive 110. For example, the side wall barrier 120 in the present embodiment may be a close continuous quadrangular pattern. However, in other embodiments of the disclosure, the side wall barrier 120 may also be a discontinuous pattern (not shown, for example, a discontinuous quadrangular pattern) formed in the adhesive 110. However, in the disclosure, the side wall barrier 120 is not limited to a quadrangular pattern, and other types of patterns may also be applied to the disclosure.

Referring to FIG. 1A again, in the present embodiment, when the side wall barrier 120 is pressed and implanted into the adhesive 110, at least a part of the side wall barrier 120 is not in contact with the first de-bonding film 130. In addition, when the second de-bonding film 140 is adhered with the adhesive 110, at least a part of the side wall barrier 120 is not in contact with the second de-bonding film 140. It should be noted that the contact extent (i.e., the size of the contact area) between the side wall barrier 120 and the first de-bonding film 130 and/or the second de-bonding film 140 is related to the process control. Because the implanted depth and position of the side wall barrier 120 cannot be precisely controlled and the height of the side wall barrier 120 and the thickness of the adhesive 110 come with certain errors, when different parts of the functional film 100 are observed, the side wall barrier 120 may be floated in the adhesive 110 and not in contact with the first de-bonding film 130 and/or the second de-bonding film 140, the side wall barrier 120 may be in contact with only the first de-bonding film 130 or the second de-bonding film 140, or the side wall barrier 120 may be in contact with both the first de-bonding film 130 and the second de-bonding film 140. Additionally, the section of the side wall barrier 120 in the present embodiment may be a quadrangular section (as shown in FIG. 1A). However, the disclosure is not limited thereto, and the cross-section of the side wall barrier 120 may also be a polygonal section, a circular section, or an oval section.

Figure 2A:
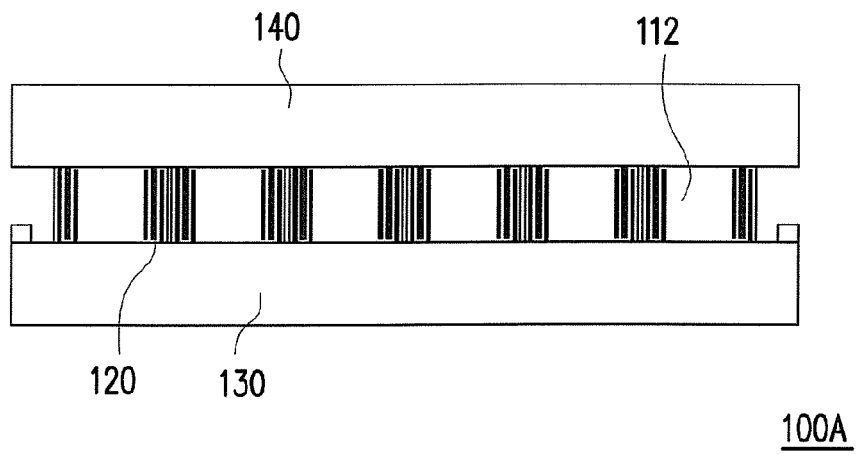
FIG. 2A is a cross-sectional view of another functional film according to the first embodiment of the disclosure.
Figure 2B:
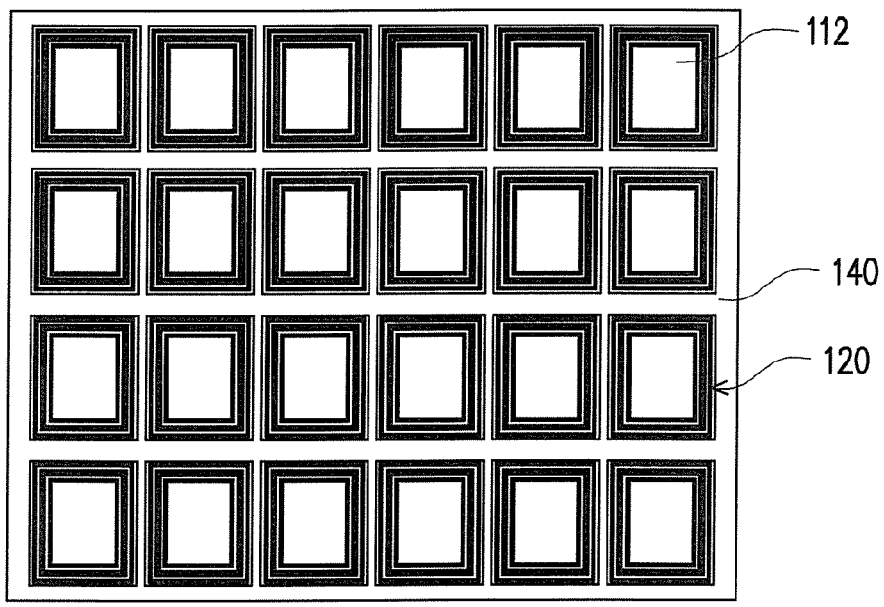
FIG. 2B is a top view of the functional film in FIG. 2A.

FIG. 2A is a cross-sectional view of another functional film according to the first embodiment of the disclosure, and FIG. 2B is a top view of the functional film in FIG. 2A. Referring to FIG. 2A and FIG. 2B, the functional film 100A in FIG. 2A is similar to the functional film 100 in FIG. 1A except that the adhesive 110 in the present embodiment includes a plurality of adhesive segments 112 arranged in an array, wherein the adhesive segments 112 are separated from each other. In addition, the side wall barrier 120 may be respectively distributed in the adhesive segments 112 through a compression implantation technique.

Below, different manufacturing methods of a functional film will be described with reference to FIGS. 3A-3C and FIGS. 3A'-3C'. It should be noted that throughout the embodiments, like reference numerals refer to the like elements and descriptions thereof are omitted.

Figure 3A:
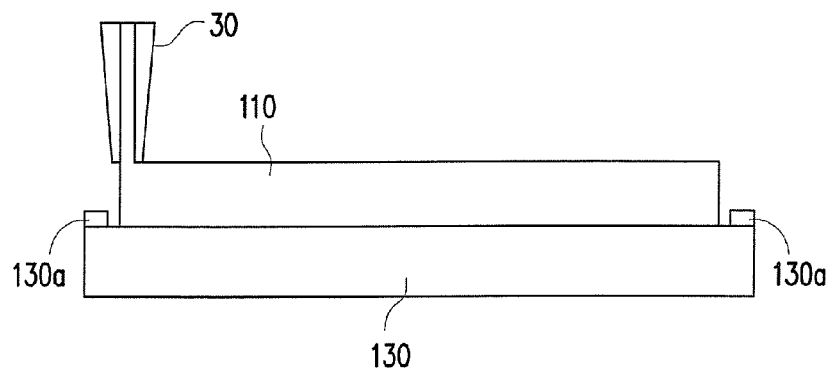
FIGS. 3A-3C are diagrams illustrating a manufacturing method of the functional film in FIG. 1A.
Figure 3B:
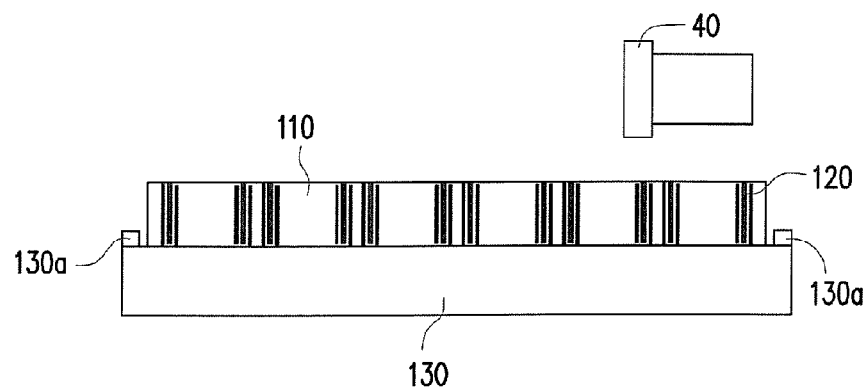
Figure 3C:
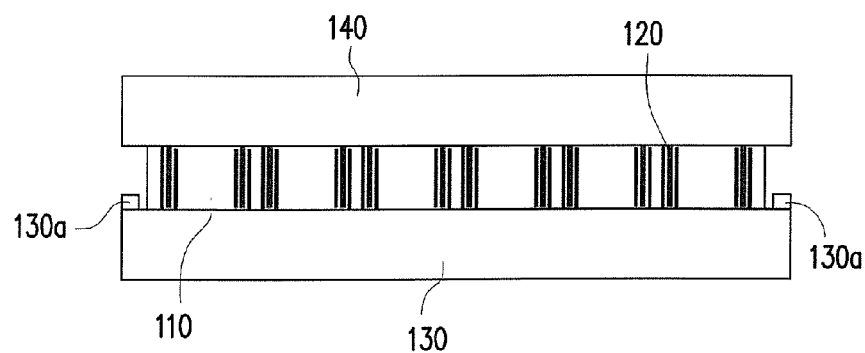
Figure 3A:
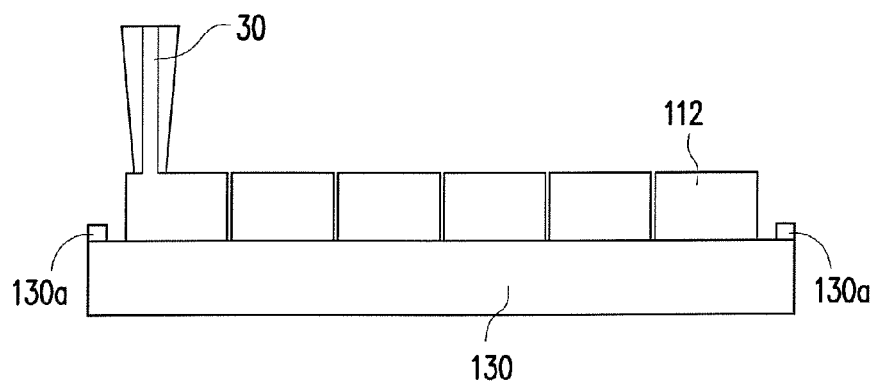
Figure 3B:
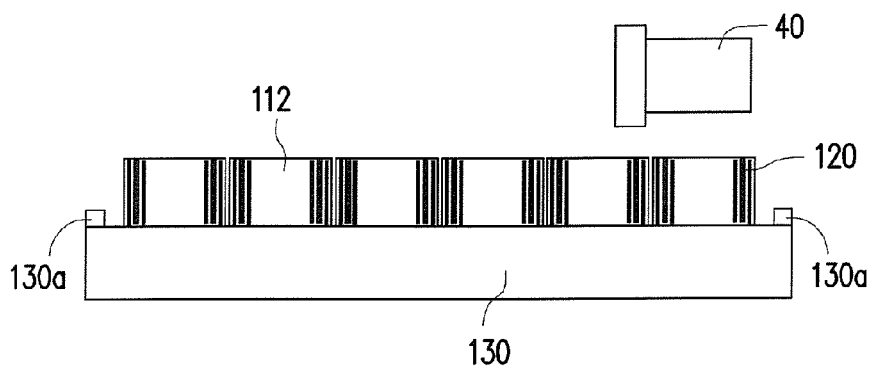
Figure 3C:
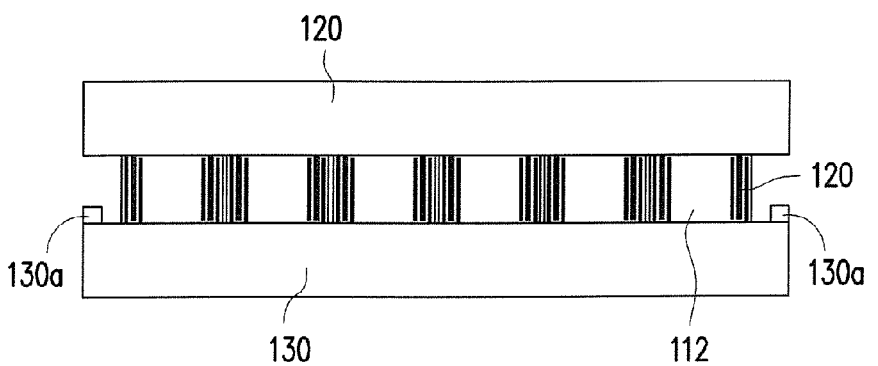

FIGS. 3A-3C are diagrams illustrating a manufacturing method of the functional film in FIG. 1A. Referring to FIG. 3A, first, the adhesive 110 is formed on the first de-bonding film 130. The first de-bonding film 130 has an alignment mark 130a, and the adhesive 110 may be supplied and coated on the first de-bonding film 130 through a dispensing head 30. For example, the adhesive 110 does not cover the alignment mark 130a, and accordingly the alignment mark 130a is located outside the distribution area of the adhesive 110. However, the disclosure is not limited thereto, and the distribution area of the adhesive 110 may also completely or partially cover the alignment mark 130a. The alignment mark 130a ensures that the dispensing head 30 supplies the adhesive 110 at the correct position on the first de-bonding film 130.

Referring to FIG. 3B, the side wall barrier 120 is then formed in the adhesive 110. The side wall barrier 120 may be picked up by a gauge 40 and then implanted into the adhesive 110 by the gauge 40 through a compression implantation technique. When the side wall barrier 120 is implanted into the adhesive 110, at least a part of the side wall barrier 120 is not in contact with the first de-bonding film 130.

Referring to FIG. 3C, the second de-bonding film 140 is adhered with the adhesive 110 so that the adhesive 110 is between the first de-bonding film 130 and the second de-bonding film 140. In other words, the first de-bonding film 130 and the second de-bonding film 140 are respectively adhered with two opposite surfaces of the adhesive 110. When the second de-bonding film 140 is adhered with the adhesive 110, at least a part of the side wall barrier 120 is not in contact with the second de-bonding film 140. When different parts of the functional film 100 are observed, the side wall barrier 120 may be floated in the adhesive 110 and not in contact with the first de-bonding film 130 and/or the second de-bonding film 140, the side wall barrier 120 may be in contact with only the first de-bonding film 130 or the second de-bonding film 140, or the side wall barrier 120 may be in contact with both the first de-bonding film 130 and the second de-bonding film 140. The manufacturing the functional film 100 is completed after the manufacturing steps illustrated in FIGS. 3A-3C are sequentially executed.

Even though the present embodiment is described by taking the manufacturing method of the functional film 100 which has both the first de-bonding film 130 and the second de-bonding film 140 as an example, in other embodiments, the functional film 100 may also have only one de-bonding film. To be specific, the adhesive 110 is only formed on the first de-bonding film 130, and then the side wall barrier 120 is formed in the adhesive 110. Namely, the manufacturing of the functional film 100 having only the first de-bonding film 130 is completed after the manufacturing steps illustrated in FIGS. 3A-3B are sequentially executed. In another embodiment, the functional film 100 may also have only the second de-bonding film 140.

FIGS. 3A'-3C' are diagrams illustrating a manufacturing method of the functional film in FIG. 2A. Referring to FIG. 3A', first, the adhesive segments 112 are formed on the first de-bonding film 130. The first de-bonding film 130 has an alignment mark 130a, and the adhesive segments 112 may be supplied and coated on the first de-bonding film 130 through the dispensing head 30. For example, the distribution area of the adhesive segments 112 does not cover the alignment mark 130a, and accordingly the alignment mark 130a is located outside the distribution area of the adhesive segments 112. However, the disclosure is not limited thereto, and the distribution area of the adhesive segments 112 may also completely or partially cover the alignment mark 130a. In addition, as shown in FIG. 3A', the adhesive segments 112 in the present embodiment are arranged in an array and are separated from each other. Next, referring to FIG. 3B', the side wall barrier 120 is formed in the adhesive segments 112. The side wall barrier 120 may be picked up by the gauge 40 and then respectively implanted into the corresponding adhesive segments 112 by the gauge 40 through a compression implantation technique. When the side wall barrier 120 is implanted into the corresponding adhesive segments 112, at least a part of the side wall barrier 120 is not in contact with the first de-bonding film 130.

Finally, referring to FIG. 3C', the second de-bonding film 140 is adhered with the adhesive segments 112 so that the adhesive segments 112 are between the first de-bonding film 130 and the second de-bonding film 140. In other words, the first de-bonding film 130 and the second de-bonding film 140 are respectively adhered with two opposite surfaces of the adhesive segments 112. When the second de-bonding film 140 is adhered with the adhesive segments 112, at least a part of the side wall barrier 120 is not in contact with the second de-bonding film 140. The manufacturing of the functional film 100A is completed after the manufacturing steps illustrated in FIGS. 3A'-3C' are sequentially executed.

Even though the present embodiment is described by taking the manufacturing method of the functional film 100A which has both the first de-bonding film 130 and the second de-bonding film 140 as an example, in other embodiments, the functional film 100A may also have a single de-bonding film. To be specific, the adhesive segments 112 may be formed only on the first de-bonding film 130, and then the side wall barrier 120 is formed in the adhesive segments 112. Namely, the manufacturing of the functional film 100A having only the first de-bonding film 130 is completed after the manufacturing steps illustrated in FIGS. 3A'-3B' are sequentially executed. In another embodiment, the functional film 100A may also have only the second de-bonding film 140.

Second Embodiment

Figure 4A:
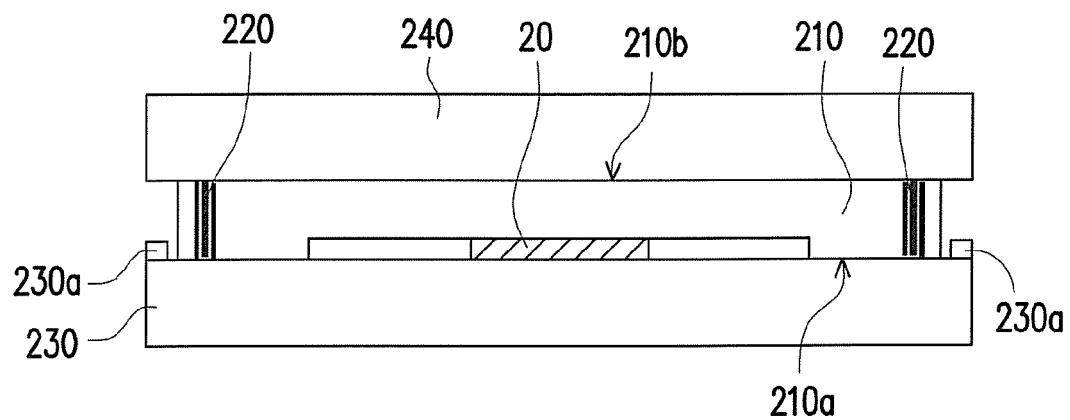
FIG. 4A is a cross-sectional view of an environmentally sensitive electronic device package according to a second embodiment of the disclosure.

FIG. 4A is a cross-sectional view of an environmentally sensitive electronic device package according to the second embodiment of the disclosure. Referring to FIG. 4A, the environmentally sensitive electronic device package 200 in the present embodiment includes a first adhesive 210, at least one first side wall barrier 220, a first substrate 230, and a second substrate 240. The first adhesive 210 has a first surface 210a and a second surface 210b opposite to the first surface 210a. The first side wall barrier 220 is distributed in the first adhesive 210. The first substrate 230 is bonded with the first surface 210a, wherein an environmentally sensitive electronic device 20 is disposed on the first substrate 230, and the environmentally sensitive electronic device 20 may be surrounded or not surrounded by the first side wall barrier 220. The second substrate 240 is bonded with the second surface 210b. Through the disposition of the first adhesive 210 and the first side wall barrier 220, moisture and oxygen can be effectively obstructed from entering, and accordingly the lifespan of the environmentally sensitive electronic device 20 can be effectively prolonged.

In the present embodiment, the first adhesive 210 may be made of epoxy, acrylic compound, or silicone. The first adhesive 210 may be made of a material which is cured through heating or light irradiation. Besides, the first adhesive 210 is well bonded with the first substrate 230 and the second substrate 240 and no de-lamination will occur. Thus, moisture and oxygen can be effectively obstructed from entering. The first side wall barrier 220 may be made of a metal or a metal oxide. The first substrate 230 and the second substrate 240 may be flexible substrates made of PE plastic, PMMA, polycarbonate (PC), or polyimide (PI). For example, aforementioned PE plastic may be PEC, PEN, or PES flexible plastic. However, the disclosure is not limited thereto, and the flexible substrates may also be made of metals.

In addition, the environmentally sensitive electronic device 20 may be an active environmentally sensitive display device or a passive environmentally sensitive display device. The active environmentally sensitive display device may be an active matrix organic light emitting diode (AM-OLED), and the passive environmentally sensitive display device may be a passive matrix organic light emitting diode (PM-OLED).

In addition, the first substrate 230 in the present embodiment has an alignment mark 230a. The second substrate 240 can be adhered with the first adhesive 210 by using the alignment mark 230a as a reference point, so that the accuracy of alignment between the first substrate 230 and the second substrate 240 can be improved. The alignment mark 230a is outside the distribution area of the first adhesive 210. However, the disclosure is not limited thereto, and in other embodiments, the alignment mark 230a may also be completely or partially covered by the first adhesive 210.

Figure 4B:
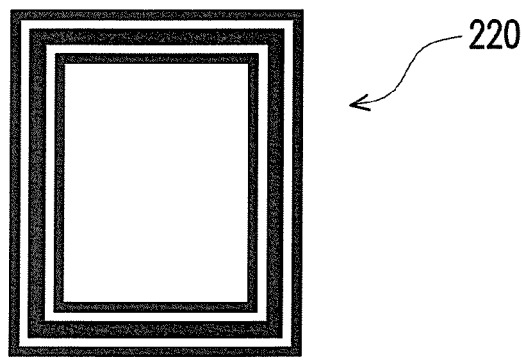
FIG. 4B is a partial top view of the environmentally sensitive electronic device package in FIG. 4A.
Figure 4C:
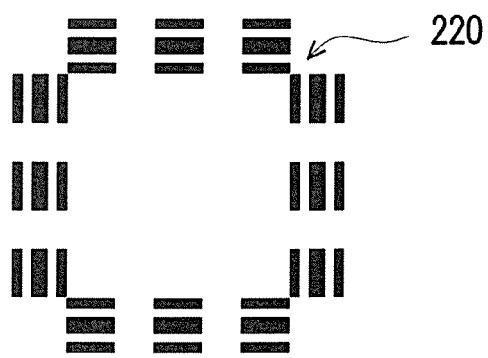
FIG. 4C is a cross-sectional view of a side wall barrier according to the second embodiment of the disclosure.

FIG. 4B is a partial top view of the environmentally sensitive electronic device package in FIG. 4A, and FIG. 4C is a cross-sectional view of another side wall barrier according to the second embodiment of the disclosure. Referring to FIG. 4B, the first side wall barrier 220 in the present embodiment may be a continuous pattern (for example, a close continuous quadrangular pattern) formed in the first adhesive 210. Referring to FIG. 4C, in another embodiment of the disclosure, the first side wall barrier 220 is a discontinuous pattern (for example, a discontinuous quadrangular pattern) formed in the first adhesive 210. However, the first side wall barrier 220 is not limited to a quadrangular pattern in the disclosure, and other types of patterns may also be adopted in the disclosure.

Referring to FIG. 4A again, in the present embodiment, when the first side wall barrier 220 is pressed and implanted into the first adhesive 210, at least a part of the first side wall barrier 220 is not in contact with the first substrate 230. In addition, when the second substrate 240 is bonded with the first adhesive 210, at least a part of the first side wall barrier 220 is not in contact with the second substrate 240. It should be noted that the contact extent (i.e., the size of the contact area) between first side wall barrier 220 and the first substrate 230 and/or the second substrate 240 is related to the process control. Because the implanted depth and position of the first side wall barrier 220 cannot be precisely controlled and the height of the first side wall barrier 220 and the thickness of the first adhesive 210 come with certain errors, when different parts of the first adhesive 210 are observed, the first side wall barrier 220 may be floated in the first adhesive 210 and not in contact with the first substrate 230 and/or the second substrate 240, the first side wall barrier 220 may be in contact with only the first substrate 230 or the second substrate 240, or the first side wall barrier 220 may be in contact with both the first substrate 230 and the second substrate 240. Additionally, the section of the first side wall barrier 220 in the present embodiment may be a quadrangular section. However, the disclosure is not limited thereto, and the cross-section of the first side wall barrier 220 may also be a polygonal section, a circular section, or an oval section.

Below, different types of environmentally sensitive electronic device packages will be described with reference to FIG. 5 (the third embodiment) to FIG. 7 (the fifth embodiment). It should be noted that throughout following embodiments, like reference numerals refer to the like elements and descriptions thereof are omitted.

Third Embodiment

Figure 5:
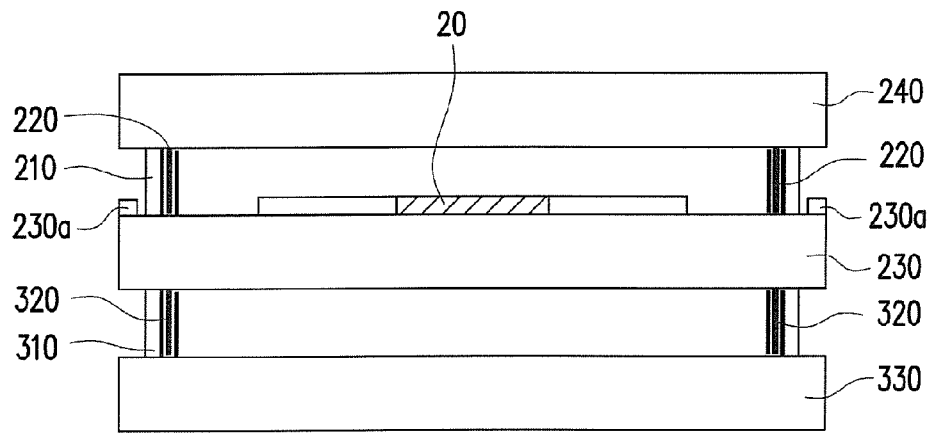
FIG. 5 is a cross-sectional view of an environmentally sensitive electronic device package according to a third embodiment of the disclosure.

FIG. 5 is a cross-sectional view of an environmentally sensitive electronic device package according to the third embodiment of the disclosure. Referring to FIG. 4A and FIG. 5, the environmentally sensitive electronic device package 300 in the present embodiment is similar to the environmentally sensitive electronic device package 200 in the second embodiment (i.e., FIG. 4A) except that the environmentally sensitive electronic device package 300 in the present embodiment further includes a second adhesive 310, a second side wall barrier 320, and a third substrate 330. The second adhesive 310 is disposed on the external surface of the first substrate 230 so that the first substrate 230 is between the first adhesive 210 and the second adhesive 310. The second side wall barrier 320 is distributed in the second adhesive 310. The third substrate 330 is disposed on the second adhesive 310 so that the second adhesive 310 is between the first substrate 230 and the third substrate 330. Through the disposition of the second adhesive 310, the second side wall barrier 320, and the third substrate 330, moisture and oxygen can be effectively obstructed from entering. Namely, the moisture and oxygen obstruction capability of the first substrate 230 is enhanced, so that the lifespan of the environmentally sensitive electronic device 20 is effectively prolonged.

In the present embodiment, the second adhesive 310 may be made of epoxy, acrylic compound, or silicone. The second adhesive 310 may be made of a material which is cured through heating or light irradiation. Besides, the second adhesive 310 is well bonded with the first substrate 230 and the third substrate 330 and no de-lamination will occur. Thus, moisture and oxygen can be effectively obstructed from entering. The second side wall barrier 320 may be made of a metal or a metal oxide. The third substrate 330 may be a flexible substrate made of PE plastic, PMMA, PC, or PI. For example, aforementioned PE plastic may be PEC, PEN, or PES flexible plastic. However, the disclosure is not limited thereto, and the flexible substrate may also be made of a metal.

In the present embodiment, the contact extent (i.e., the size of the contact area) between the second side wall barrier 320 and the first substrate 230 and/or the third substrate 330 is related to the process control. Because the implanted depth and position of the second side wall barrier 320 cannot be precisely controlled and the height of the second side wall barrier 320 and the thickness of the second adhesive 310 come with certain errors, when different parts of the second adhesive 310 are observed, the second side wall barrier 320 may be floated in the second adhesive 310 and not in contact with the first substrate 230 and/or the third substrate 330, the second side wall barrier 320 may be in contact with only the first substrate 230 or the third substrate 330, or the second side wall barrier 320 may be in contact with both the first substrate 230 and the third substrate 330.

Fourth Embodiment

Figure 6:
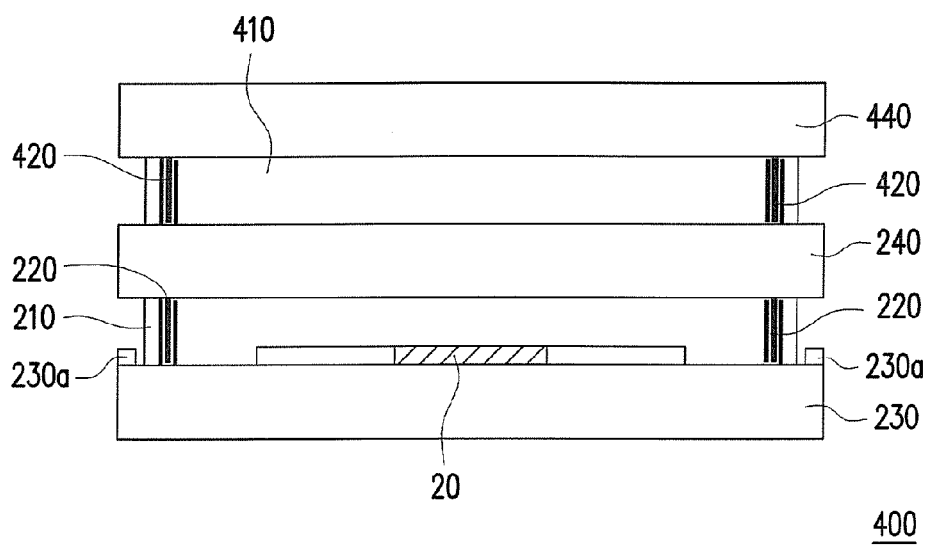
FIG. 6 is a cross-sectional view of an environmentally sensitive electronic device package according to a fourth embodiment of the disclosure.

FIG. 6 is a cross-sectional view of an environmentally sensitive electronic device package according to the fourth embodiment of the disclosure. Referring to FIG. 4A and FIG. 6, the environmentally sensitive electronic device package 400 in the present embodiment is similar to the environmentally sensitive electronic device package 200 in the second embodiment (i.e., FIG. 4A) except that the environmentally sensitive electronic device package 400 in the present embodiment further includes a third adhesive 410, a third side wall barrier 420, and a fourth substrate 440. The third adhesive 410 is disposed on the external surface of the second substrate 240 so that the third adhesive 410 is between the second substrate 240 and the fourth substrate 440. The third side wall barrier 420 is distributed in the third adhesive 410. The third substrate 330 is disposed on the third adhesive 410 so that the third adhesive 410 is between the second substrate 240 and the fourth substrate 440. Through the disposition of the third adhesive 410, the third side wall barrier 420, and the fourth substrate 440, moisture and oxygen can be effectively obstructed from entering. Namely, the moisture and oxygen obstruction capability of the second substrate 240 is enhanced, so that the lifespan of the environmentally sensitive electronic device 20 is effectively prolonged.

In the present embodiment, the third adhesive 410 may be made of epoxy, acrylic compound, or silicone. The third adhesive 410 may be made of a material which is cured through heating or light irradiation. Besides, the third adhesive 410 is well bonded with the second substrate 240 and the fourth substrate 440 and no de-lamination will occur. Thus, moisture and oxygen can be effectively obstructed from entering. The third side wall barrier 420 may be made of a metal or a metal oxide. The fourth substrate 440 may be a flexible substrate made of PE plastic, PMMA, PC, or PI. For example, aforementioned PE plastic may be PEC, PEN, or PES flexible plastic. However, the disclosure is not limited thereto, and the flexible substrate may also be made of a metal.

In the present embodiment, the contact extent (i.e., the size of the contact area) between the third side wall barrier 420 and the second substrate 240 and/or the fourth substrate 440 is related to the process control. Because the implanted depth and position of the third side wall barrier 420 cannot be precisely controlled and the height of the third side wall barrier 420 and the thickness of the third adhesive 410 come with certain errors, when different parts of the third adhesive 410 are observed, the third side wall barrier 420 may be floated in the third adhesive 410 and not in contact with the second substrate 240 and the fourth substrate 440, the third side wall barrier 420 may be in contact with only the second substrate 240 or the fourth substrate 440, or the third side wall barrier 420 may be in contact with both the second substrate 240 and the fourth substrate 440.

Fifth Embodiment

Figure 7:
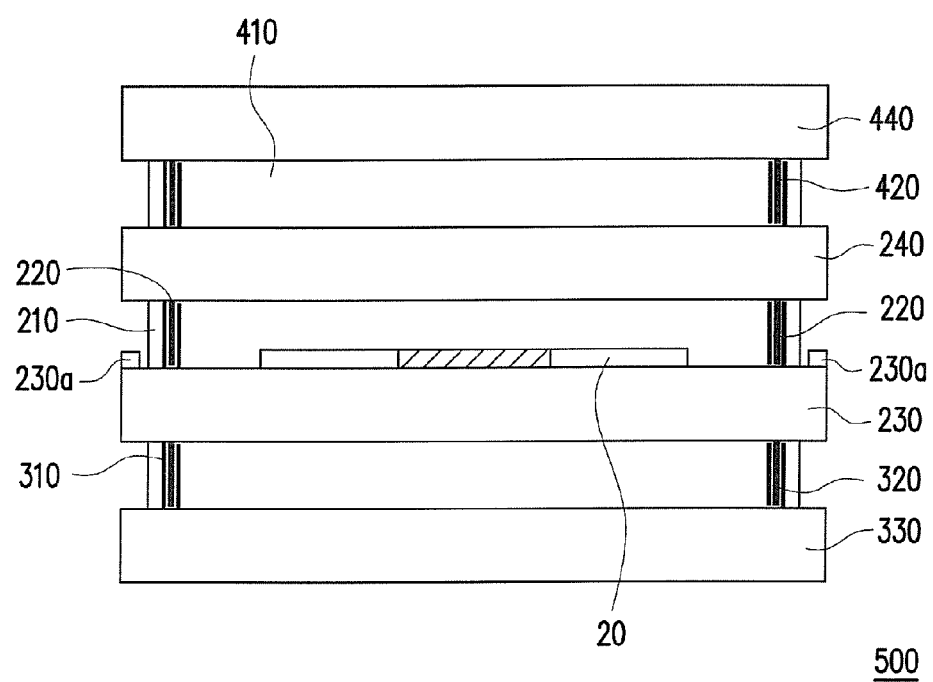
FIG. 7 is a cross-sectional view of an environmentally sensitive electronic device package according to a fifth embodiment of the disclosure.

FIG. 7 is a cross-sectional view of an environmentally sensitive electronic device package according to the fifth embodiment of the disclosure. Referring to FIG. 5 and FIG. 7, the environmentally sensitive electronic device package 500 in the present embodiment is similar to the environmentally sensitive electronic device package 300 in the third embodiment (i.e., FIG. 5) except that the environmentally sensitive electronic device package 500 in the present embodiment further includes a third adhesive 410, a third side wall barrier 420, and a fourth substrate 440. The third adhesive 410 is disposed on the external surface of the second substrate 240, so that the third adhesive 410 is between the second substrate 240 and the fourth substrate 440. The third side wall barrier 420 is distributed in the third adhesive 410. The third substrate 330 is disposed on the third adhesive 410, so that the third adhesive 410 is between the second substrate 240 and the fourth substrate 440. Through the disposition of the second adhesive 310, the second side wall barrier 320, the third substrate 330, the third adhesive 410, the third side wall barrier 420, and the fourth substrate 440, moisture and oxygen can be effectively obstructed from entering. Namely, the moisture and oxygen obstruction capability of the first substrate 230 and the second substrate 240 is enhanced, so that the lifespan of the environmentally sensitive electronic device 20 is effectively prolonged.

Below, manufacturing methods of different types of environmentally sensitive electronic device packages will be described with reference to FIGS. 8A-8E, FIG. 8C', and FIG. 8D'.

Figure 8A:
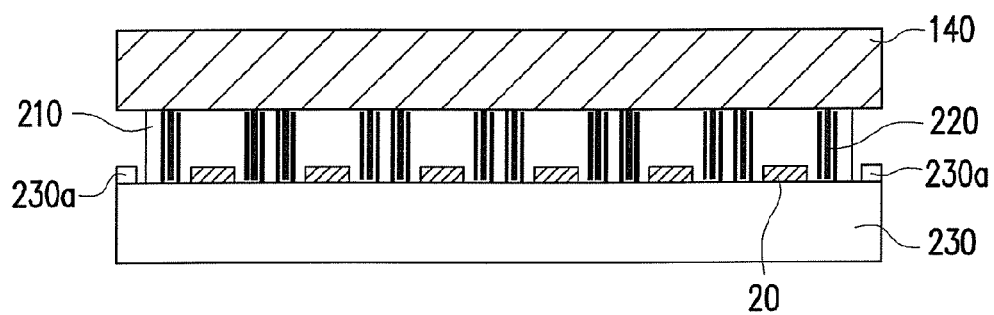
FIGS. 8A-FIG. 8E, FIG. 8C', and FIG. 8D' are diagrams illustrating a manufacturing method of an environmentally sensitive electronic device package according to the disclosure.
Figure 8B:
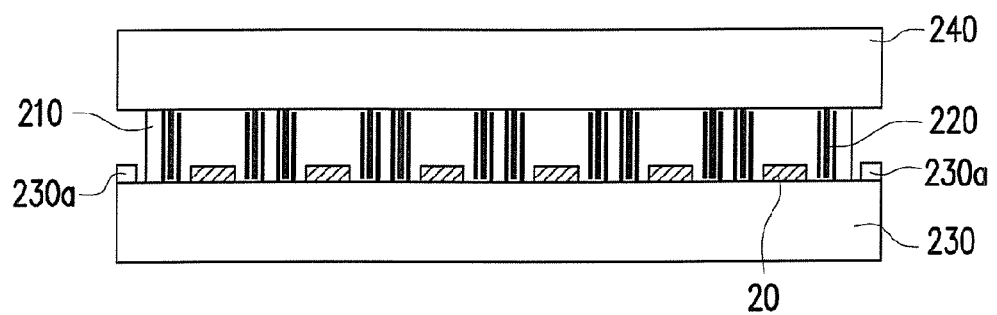
Figure 8C:
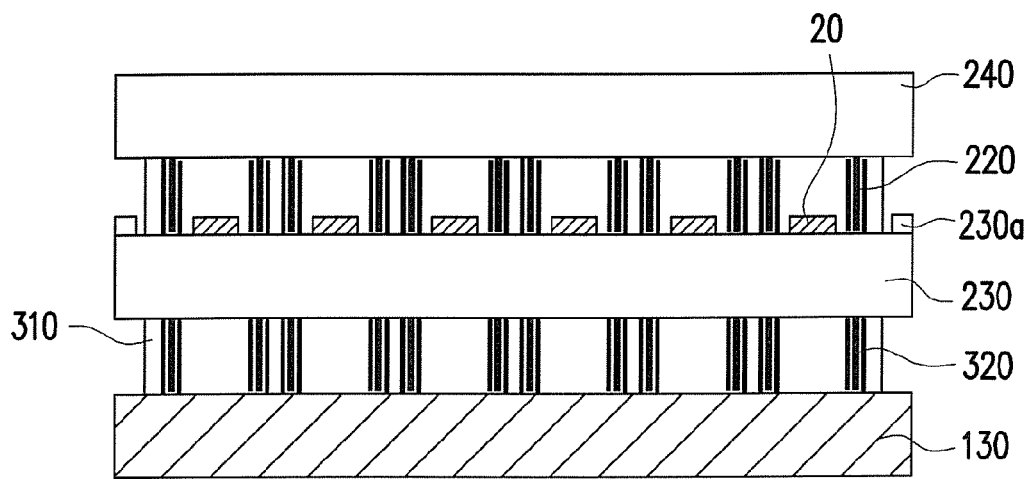
Figure 8C:
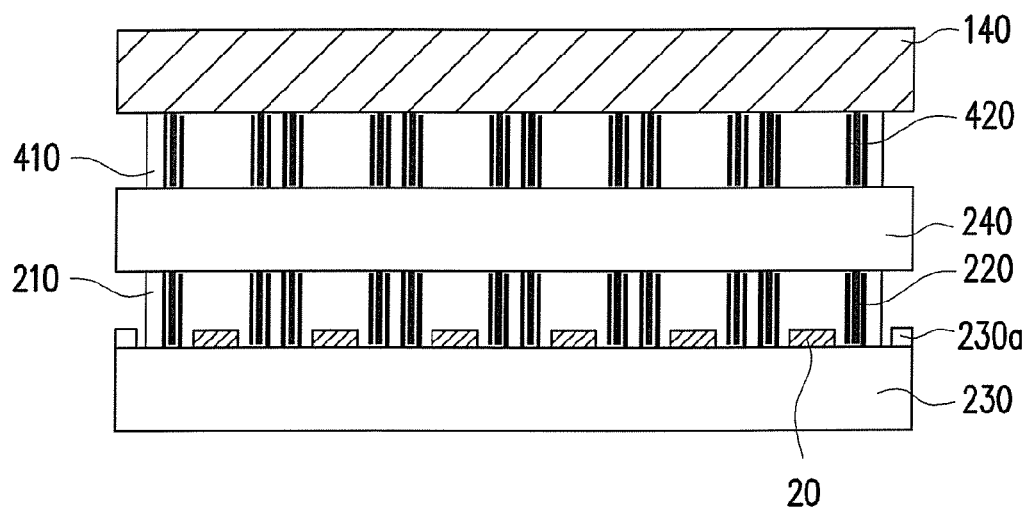
Figure 8D:
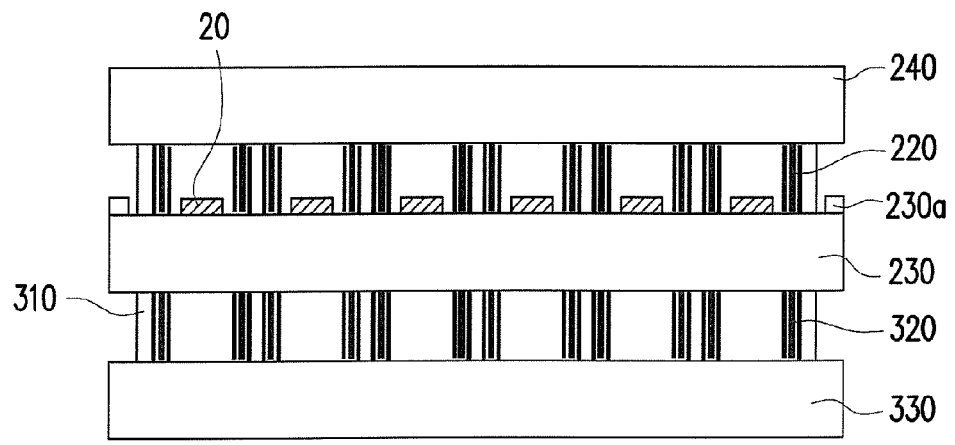
Figure 8D:
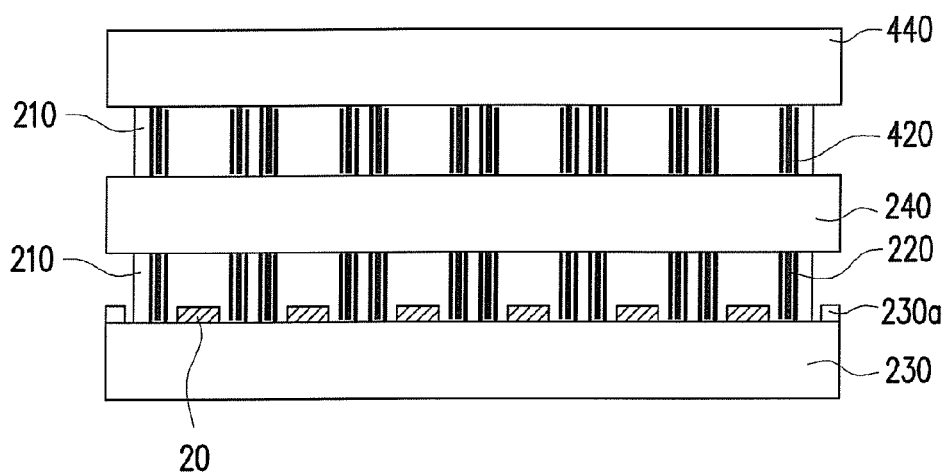

FIGS. 8A-FIG. 8E, FIG. 8C', and FIG. 8D' are diagrams illustrating a manufacturing method of an environmentally sensitive electronic device package according to the disclosure. Referring to FIG. 8A, first, the first adhesive 210 is formed on the first substrate 230, wherein a first side wall barrier 220 is already formed in the first adhesive 210. The first side wall barrier 220 may surround or may not surround the environmentally sensitive electronic device 20, and at least part of the first side wall barrier 220 is not in contact with the first substrate 230. To be specific, in the present embodiment, the first de-bonding film 130 of the functional film 100 in FIG. 1A can be removed by applying an appropriate force, so that the adhesive 110 is adhered with the internal surface of the first substrate 230 on which the environmentally sensitive electronic device 20 is disposed. In the present embodiment, the first substrate 230 has an alignment mark 230a such that the accuracy of alignment between the first substrate 230 and the second substrate 240 is improved. The alignment mark 230a is located outside the distribution area of the first adhesive 210. However, the disclosure is not limited thereto, and the alignment mark 230a may be completely or partially covered by the first adhesive 210. It should be noted that the coating of the first adhesive 210 formed on the first substrate 230 is not limited to the tape coating technique described above. The adhesive segments 112 shown in FIG. 2A and FIG. 2B may also be coated on the formed on the first substrate 230.

Next, referring to FIG. 8B, the second substrate 240 is adhered with the first adhesive 210 so that the first adhesive 210 is located between the first substrate 230 and the second substrate 240. To be specific, in the present embodiment, the second de-bonding film 140 of the functional film 100 in FIG. 1A can be removed by applying an appropriate force, so as to expose another surface of the functional film 100 and adhere the second substrate 240 with the surface of the adhesive 110 originally covered by the second de-bonding film 140. After that, the adhesive 110 is, for example, cured through heating or ultraviolet irradiation to form the first adhesive 210. This first adhesive 210 is well bonded with the first substrate 230 and the second substrate 240. However, in the present embodiment, the second substrate 240 may also be directly adhered with the first adhesive 210 in FIG. 8A', and the first adhesive 210 is, for example, then cured through heating or ultraviolet irradiation so that the first adhesive 210 is well bonded with the first substrate 230 and the second substrate 240. After the second substrate 240 is bonded with the first adhesive 210, at least a part of the first side wall barrier 220 is not in contact with the second substrate 240. When different parts of the environmentally sensitive electronic device package are observed, the first side wall barrier 220 may be floated in the adhesive 210 and not in contact with the first substrate 230 and/or the second substrate 240, the first side wall barrier 220 may be in contact with only the first substrate 230 or the second substrate 240, or the first side wall barrier 220 may be in contact with both the first substrate 230 and the second substrate 240.

According to the disclosure, after the steps illustrated in FIGS. 8A-8B are executed, the manufacturing of multiple environmentally sensitive electronic device packages 200 can be accomplished through a unitization process (for example, a laser cutting process or a mechanical cutting process).

Referring to FIG. 8C and FIG. 8D, according to the disclosure, after the steps illustrated in FIGS. 8A-8B are executed, the second adhesive 310 and the third substrate 330 are further formed on the external surface of the first substrate 230, wherein a second side wall barrier 320 is already formed in the second adhesive 310. It should be noted that in the present embodiment, the technique of forming the second adhesive 310 is similar to that of forming the first adhesive 210. The bonding between the third substrate 330 and the second adhesive 310 is the same as that between the first substrate 230 and the first adhesive 210. Therefore, descriptions of the bonding between the third substrate 330 and the second adhesive 310 are omitted.

According to the disclosure, after the steps illustrated in FIG. 8C and FIG. 8D are executed, the manufacturing of multiple environmentally sensitive electronic device packages 300 can be accomplished through a unitization process (for example, a laser cutting process or a mechanical cutting process).

Referring to FIG. 8C' and FIG. 8D', according to the disclosure, after the steps illustrated in FIGS. 8A-8B are executed, the third adhesive 410 and the fourth substrate 440 are further formed on the external surface of the second substrate 240, wherein a third side wall barrier 420 is already formed in the third adhesive 410. It should be noted that in the present embodiment, the technique of forming the third adhesive 410 is similar to that of forming the first adhesive 210 and the bonding between the fourth substrate 440 and the third adhesive 410 is the same as the bonding between the first substrate 230 and the first adhesive 210. Therefore, descriptions of the bonding between the third substrate 330 and the second adhesive 310 are omitted.

According to the disclosure, after the steps illustrated in FIG. 8C' and FIG. 8D' are executed, the manufacturing of multiple environmentally sensitive electronic device packages 400 can be accomplished through a unitization process (for example, a laser cutting process or a mechanical cutting process).

Figure 8E:
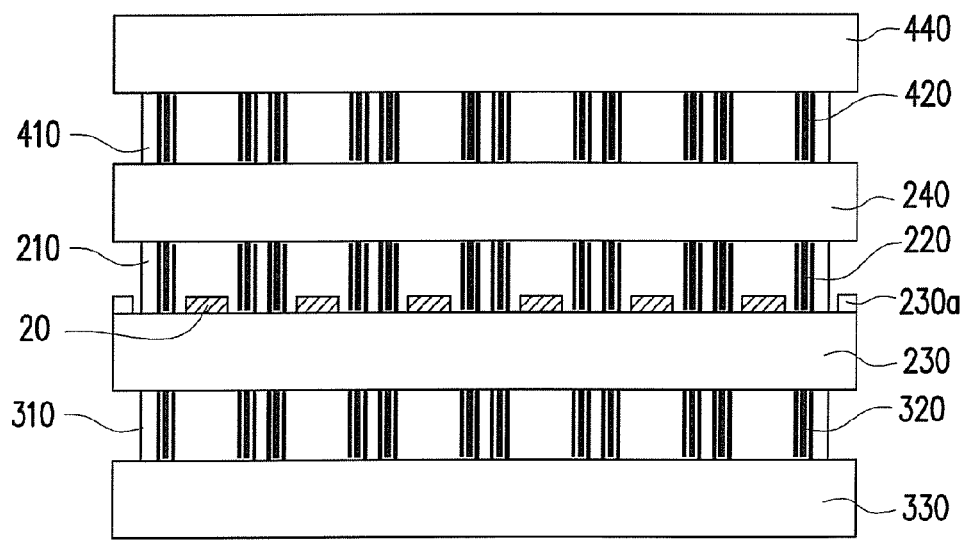

Thereafter, referring to FIG. 8E, according to the disclosure, the second adhesive 310 and the third substrate 330 are formed on the external surface of the first substrate 230 at the same time, and the third adhesive 410 and the fourth substrate 440 are formed on the external surface of the second substrate 240.

According to the disclosure, after the step illustrated in FIG. 8E is executed, the manufacturing of multiple environmentally sensitive electronic device packages 500 can be accomplished through a unitization process (for example, a laser cutting process or a mechanical cutting process).

Besides the manufacturing methods of functional films and environmentally sensitive electronic device packages described above, according to the disclosure, the functional films and the environmentally sensitive electronic device packages may also be manufactured through other techniques. Below, the techniques of manufacturing a functional film and an environmentally sensitive electronic device package by using a roll-to-roll equipment will be respectively described with reference to FIG. 9 (the sixth embodiment) and FIG. 10 (the seventh embodiment). It should be noted that throughout the embodiments, like reference numerals refer to the like elements and descriptions thereof are omitted.

Sixth Embodiment

Figure 9:
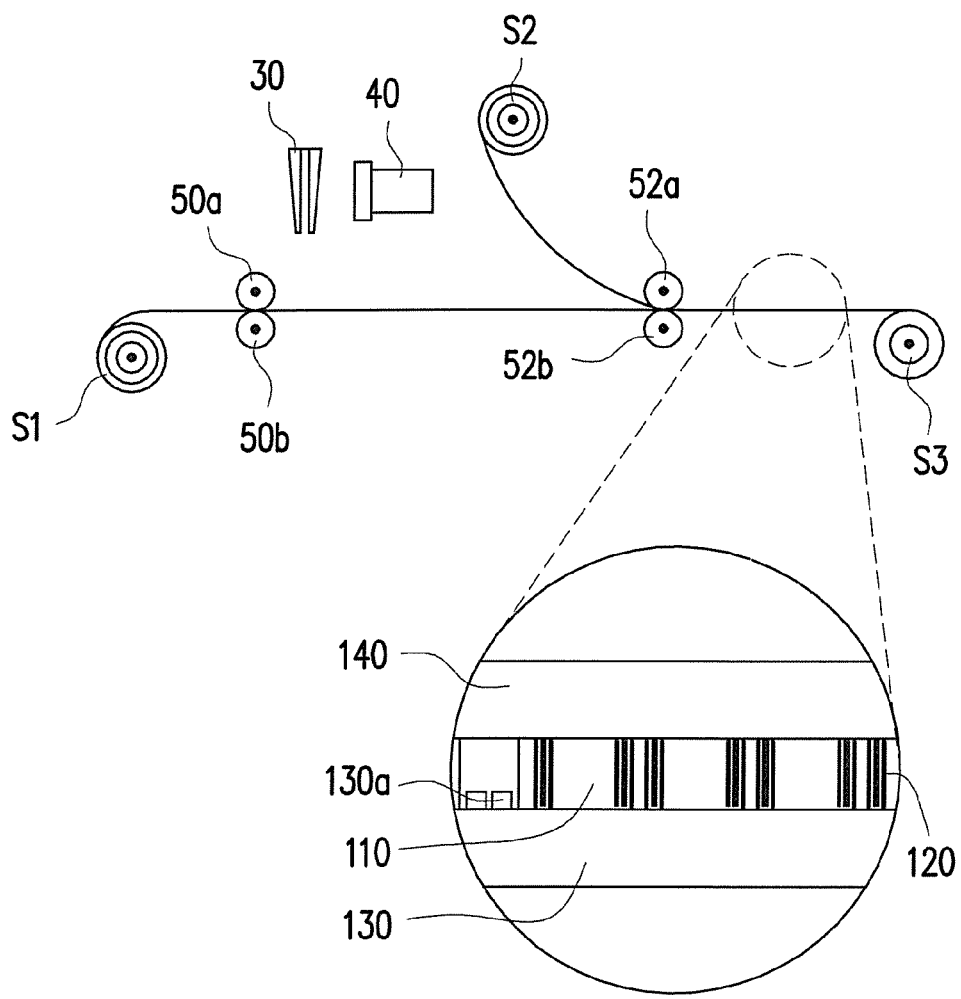
FIG. 9 is a diagram illustrating a roll-to-roll manufacturing process of a functional film according to a sixth embodiment of the disclosure.

FIG. 9 is a diagram illustrating a roll-to-roll manufacturing process of a functional film according to the sixth embodiment of the disclosure. Referring to FIG. 9, in the present embodiment, the first de-bonding film 130 is furled into a structure roll S1, and the second de-bonding film 140 is furled into a structure roll S2. The first de-bonding film 130 is driven by a wheel 50a and a wheel 50b and is released from the structure roll S1. Through the driving of a wheel 52a and a wheel 52b, the first de-bonding film 130 is continuously conveyed, so that the adhesive 110 can be coated on the first de-bonding film 130. Some of the wheels 50a, 50b, 52a, and 52b are driving wheels, while the rest are idler wheel. A driving wheel offers a driving force, while an idler wheel is capable of guiding the convey direction.

The first de-bonding film 130 has an alignment mark 130a. When the first de-bonding film 130 is conveyed, the adhesive 110 is supplied and coated on the first de-bonding film 130 through a dispensing head 30. For example, because the distribution area of the adhesive 110 does not cover the alignment mark 130a, the alignment mark 130a is located outside the distribution area of the adhesive 110. However, the adhesive may also completely or partially cover the alignment mark 130a.

After the adhesive 110 is coated, a side wall barrier 120 is formed in the adhesive 110. The side wall barrier 120 may be picked up by a gauge 40 and then implanted into the adhesive 110 by the gauge 40 through a compression implantation technique. When the side wall barrier 120 is implanted into the adhesive 110, at least a part of the side wall barrier 120 is not in contact with the first de-bonding film 130. The adhesive 110 with the side wall barrier 120 and the first de-bonding film 130 are continuously conveyed to pass through between the wheel 52a and the wheel 52b. The second de-bonding film 140 is driven by the wheel 52a and the wheel 52b and is released from the structure roll S2. Through the driving of the wheel 52a and the wheel 52b, the second de-bonding film 140 is pressed on the adhesive 110 so that the adhesive 110 is between the first de-bonding film 130 and the second de-bonding film 140. In other words, the first de-bonding film 130 and the second de-bonding film 140 are respectively adhered with two opposite surfaces of the adhesive 110. When the second de-bonding film 140 is adhered with the adhesive 110, at least a part of the side wall barrier 120 is not in contact with the second de-bonding film 140. By now, the manufacturing of the functional film 100 is approximately completed. Thereafter, the functional film 100 can be furled into a structure roll S3 such that the structure roll S3 can be easily used in subsequent processes. It should be noted that the coating of the adhesive 110 over the first de-bonding film 130 is not limited to the tape coating technique described above. The adhesive segments 112 may also be coated on the first de-bonding film 130, and the functional film 100A in FIG. 2A may be formed through the roll-to-roll manufacturing process mentioned above.

Even though the present embodiment is described by taking the roll-to-roll manufacturing method of the functional film 100 having both the first de-bonding film 130 and the second de-bonding film 140 as an example, in other applicable roll-to-roll manufacturing methods, the functional film 100 may also have only one de-bonding film. In other words, the adhesive 110 may be coated only on the first de-bonding film 130. To be specific, the first de-bonding film 130 furled into the structure roll S1 can be driven by the wheel 50a and the wheel 50b to be released from the structure roll S1 and driven by the wheel 52a and the wheel 52b to be continuously conveyed, so that the adhesive 110 can be coated on the first de-bonding film 130. When the first de-bonding film 130 is conveyed, the adhesive 110 is supplied and coated on the first de-bonding film 130 through the dispensing head 30.

After the adhesive 110 is coated, the side wall barrier 120 is formed in the adhesive 110. To be specific, the side wall barrier 120 is picked up by the gauge 40 and then implanted into the adhesive 110 by the gauge 40 through a compression implantation technique. The functional film 100 having only the first de-bonding film 130 can be further furled into a structure roll (not shown). In another embodiment, the structure roll (not shown) may also be the functional film 100 having only the second de-bonding film 140.

In addition, the adhesive segments 112 may be formed on the first de-bonding film 130 or the second de-bonding film 140 only. After that, the side wall barrier 120 is formed in the adhesive segments 112, and the functional film 100A illustrated in FIG. 2A is then formed through aforementioned roll-to-roll manufacturing process.

Seventh Embodiment

Figure 10:
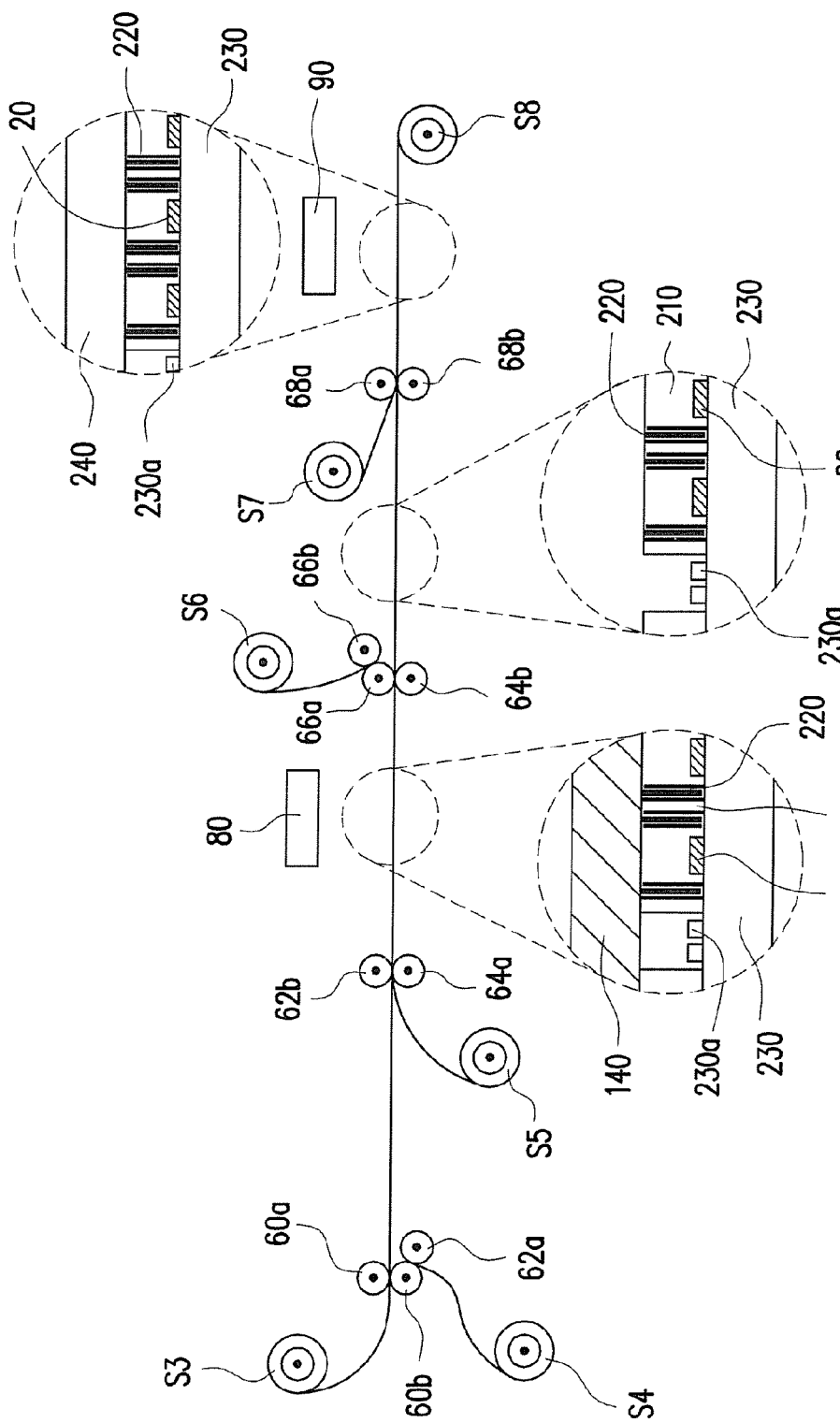
FIG. 10 is a diagram illustrating a roll-to-roll manufacturing process of an environmentally sensitive electronic device package according to a seventh embodiment of the disclosure.

FIG. 10 is a diagram illustrating a roll-to-roll manufacturing process of an environmentally sensitive electronic device package according to the seventh embodiment of the disclosure. Referring to FIG. 9 and FIG. 10, in the present embodiment, the functional film 100 is provided from the structure roll S3 in FIG. 9, the first substrate 230 is furled into a structure roll S5, and the second substrate 240 is furled into a structure roll S7.

In the present embodiment, first, the functional film 100 is driven by the wheel 60a and the wheel 60b to be released from the structure roll S3. The first de-bonding film 130 removed from the functional film 100 is driven by the wheel 62a and the wheel 60b such that the first de-bonding film 130 is furled into a structure roll S4. Besides, the functional film 100 without the first de-bonding film 130 (i.e., the adhesive 110 and the second de-bonding film 140) is driven by the wheel 64a and the wheel 62b such that the adhesive 110 and the second de-bonding film 140 are continuously conveyed. The first substrate 230 is driven by the wheel 64a and the wheel 62b and is released from the structure roll S5. The first substrate 230 is laminated together with the adhesive 110 and the second de-bonding film 140 passing through between the wheel 64a and the wheel 62b, so that the adhesive 110 is adhered with the internal surface of the first substrate 230 having the environmentally sensitive electronic device 20 formed thereon. The first substrate 230 has an alignment mark 230a such that the accuracy of alignment between the first substrate 230 and the second substrate 240 is improved. The alignment mark 230a is located outside the distribution area of the first adhesive 210. However, the adhesive may also completely or partially cover the alignment mark 130a.

Thereafter, the laminated second de-bonding film 140, adhesive 110, and first substrate 230 are driven by the wheels 66a and 66b to pass through a first curing unit 80 (for example, a thermal heating unit or a ultraviolet curing unit), so that the adhesive 110 is cured to form the first adhesive 210 and the first adhesive 210 is well bonded with the first substrate 230 and is driven and continuously conveyed by the wheel 68a and the wheel 68b.

Next, the second substrate 240 is adhered with the first adhesive 210 such that the first adhesive 210 is located between the first substrate 230 and the second substrate 240. To be specific, in the present embodiment, the second de-bonding film 140 can be removed from the first adhesive 210 by applying an appropriate force. The removed second de-bonding film 140 is driven by the wheel 66a and the wheel 66b and is furled into a structure roll S6. The second substrate 240 is driven by the wheels 68a and 68b and is released from the structure roll S7. The second substrate 240 is laminated with the first adhesive 210 and the first substrate 230 passing between the wheel 68a and wheel 68b, so that the first adhesive 210 is adhered with the internal surface of the second substrate 240. Next, the laminated second substrate 240, first adhesive 210, and first substrate 230 are continuously conveyed to pass through a second curing unit 90 (for example, a thermal curing unit or a ultraviolet curing unit), so that the first adhesive 210 is well bonded with the second substrate 240 and the first substrate 230. After the second substrate 240 is bonded with the first adhesive 210, at least a part of the first side wall barrier 220 is not in contact with the second substrate 240. It should be noted that in the present embodiment, the wheels 60a, 60b, 62a, 62b, 64a, 64b, 66a, 66b, 68a, and 68b include driving wheels and idler wheels. A driving wheel offers a driving force, while an idler wheel is capable of guiding the convey direction. However, the disclosure is not limited herein.

After the manufacturing method described above is completed, according to the disclosure, the functional film 100 can be furled into a structure roll S8 such that the structure roll S8 can be easily used in subsequent processes, or the functional film 100 can be singularized to form a plurality of environmentally sensitive electronic device packages 200 by a laser cutting process or a mechanical cutting process, for example. Of course, the structure roll S8 can be used to complete the manufacturing method illustrated in FIG. 8C and FIG. 8D, FIG. 8C', and FIG. 8D' or FIG. 8E through a roll-to-roll manufacturing process the same as or similar to that in the present embodiment. In addition, the environmentally sensitive electronic device packages 300, 400, or 500 can be singularized by a laser cutting process or a mechanical cutting process, for example.

On the other hand, in other embodiments, the roll-to-roll manufacturing process of the environmentally sensitive electronic device package in the present embodiment can be further combined with the roll-to-roll manufacturing process of the functional film n the sixth embodiment. To be specific, after the functional film 100 in FIG. 9 is completed, the functional film 100 needs not to be furled into the structure roll S3. Instead, the functional film 100 is directly driven by the wheel 60a and the wheel 60b to go through the roll-to-roll manufacturing process illustrated in FIG. 10, so as to manufacture an environmentally sensitive electronic device package 200. However, the disclosure is not limited herein.

As described above, an environmentally sensitive electronic device package provided by the disclosure offers good moisture and oxygen obstruction capability. Accordingly, the lifespan of an environmentally sensitive electronic device is effectively prolonged.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:
1. A functional film, comprising:
an adhesive having a first surface and a second surface opposite to the first surface;
at least one side wall barrier distributed in the adhesive;
a first de-bonding film adhered with the first surface; and
a second de-bonding film adhered with the second surface, wherein at least a first part of the at least one side wall barrier is floated in the adhesive and is not in contact with the first de-bonding film or the second de-bonding film.

2. The functional film according to claim 1, wherein at least one of the first de-bonding film and the second de-bonding film has at least one alignment mark, and the alignment mark is located outside a distribution area of the adhesive.

3. The functional film according to claim 1, wherein at least a second part of the at least one side wall barrier is in contact with the first de-bonding film or the second de-bonding film.

4. The functional film according to claim 1, wherein the adhesive comprises a plurality of adhesive segments arranged in an array, the adhesive segments are separated from each other, and at least one side wall barrier is distributed in one of the adhesive segments.

\* \* \* \* \*